United States Patent
Wang et al.

(10) Patent No.: US 11,171,318 B2
(45) Date of Patent: Nov. 9, 2021

(54) METHOD FOR MANUFACTURING ELECTROLUMINESCENT DEVICE WITH SACRIFICIAL LAYER

(71) Applicant: INT TECH CO., LTD., Hsinchu County (TW)

(72) Inventors: Tzu-Hao Wang, Taipei (TW); Huei-Siou Chen, Taipei (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 16/786,441

(22) Filed: Feb. 10, 2020

(65) Prior Publication Data

US 2021/0249637 A1   Aug. 12, 2021

(51) Int. Cl.
  *H01L 51/40* (2006.01)
  *H01L 51/56* (2006.01)
  *H01L 51/52* (2006.01)
  *H01L 51/50* (2006.01)

(52) U.S. Cl.
  CPC .......... *H01L 51/56* (2013.01); *H01L 51/5012* (2013.01); *H01L 51/5256* (2013.01)

(58) Field of Classification Search
  CPC . H01L 51/5012; H01L 51/56; H01L 51/5253; H01L 51/5256; H01L 27/3246
  See application file for complete search history.

(56) References Cited

U.S. PATENT DOCUMENTS

| | | | |
|---|---|---|---|
| 2010/0151609 A1* | 6/2010 | Kim | H01L 33/0093 438/33 |
| 2014/0004640 A1* | 1/2014 | Hamaguchi | H01L 51/001 438/34 |
| 2019/0189706 A1* | 6/2019 | Choi | H01L 51/56 |

* cited by examiner

*Primary Examiner* — Phuc T Dang
(74) *Attorney, Agent, or Firm* — WPAT, P.C., Intellectual Property Attorneys; Anthony King

(57) ABSTRACT

A method of manufacturing an electroluminescent device includes providing a substrate including a first pixel and a second pixel configured to emit different colors; forming a first light-emitting layer and a first protecting layer over the substrate through a first opening of a first sacrificial layer; forming a second light-emitting layer and a second protecting layer over the substrate through a second opening of a second sacrificial layer; removing the first sacrificial layer together with the second sacrificial layer; and removing the first protecting layer from the first light-emitting layer, and the second protecting layer from the second light-emitting layer.

18 Claims, 16 Drawing Sheets

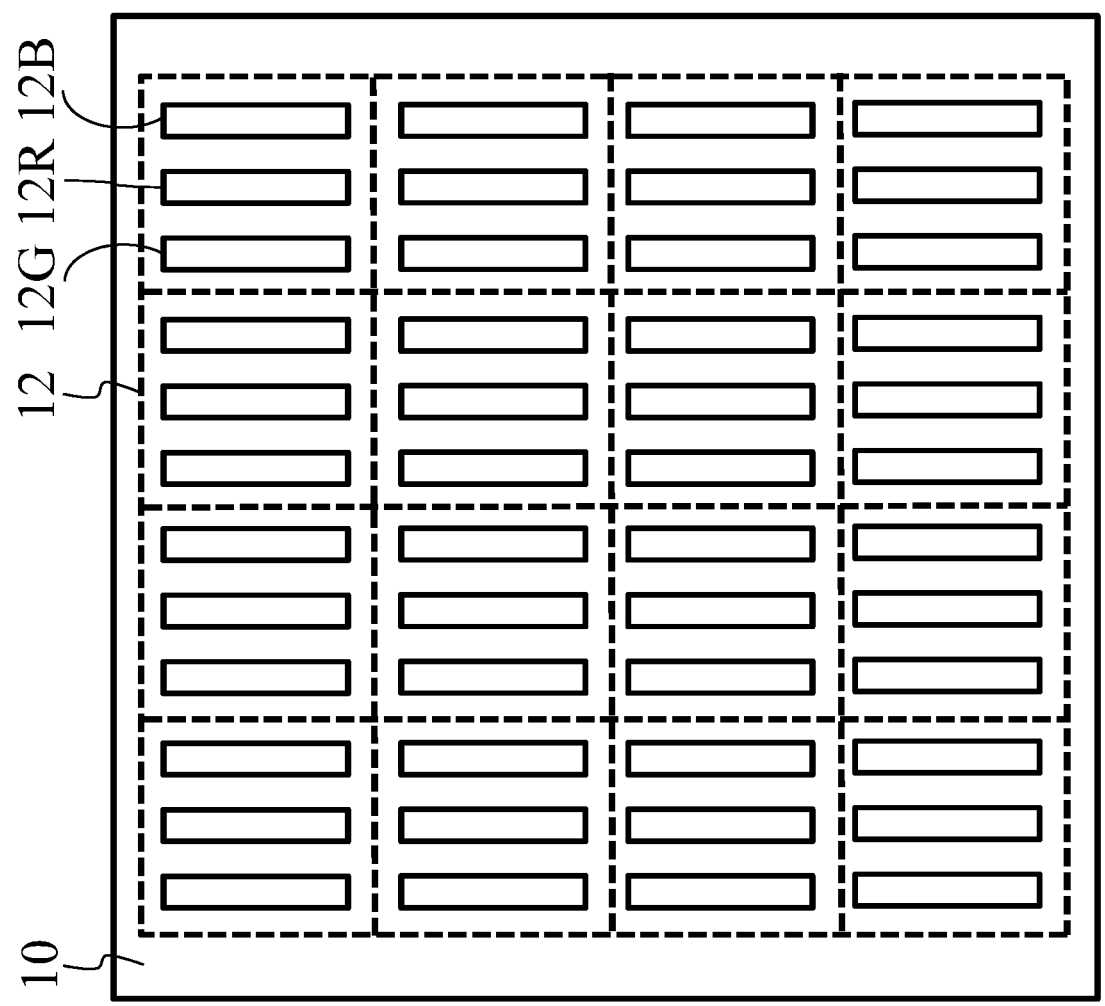

METHOD FOR MANUFACTURING ELECTROLUMINESCENT DEVICE WITH SACRIFICIAL LAYER

TECHNICAL FIELD

The present disclosure is related to a method for manufacturing an electroluminescent device, and more particularly, to a method for manufacturing an organic light-emitting device.

BACKGROUND

Organic light-emitting diodes (OLEDs) have been widely used in displays due to their advantages in latency, contrast ratio, response time, and black levels. However, due to the constraints of current color-patterning technologies, the commercialization of high-resolution OLED displays remains limited. Related manufacturing issues include low manufacturing yield, high fabrication cost, and low display quality. Therefore, the OLED industry is seeking routes to address the above issues.

SUMMARY

A method of manufacturing an electroluminescent device includes providing a substrate including a first pixel and a second pixel configured to emit different colors; forming a first light-emitting layer and a first protecting layer over the substrate through a first opening of a first sacrificial layer; forming a second light-emitting layer and a second protecting layer over the substrate through a second opening of a second sacrificial layer; removing the first sacrificial layer together with the second sacrificial layer; and removing the first protecting layer from the first light-emitting layer, and the second protecting layer from the second light-emitting layer.

In some embodiments, the removing of the first sacrificial layer together with the second sacrificial layer is performed prior to the removing of the first protecting layer and the second protecting layer.

In some embodiments, the removing of the first protecting layer is performed together with the removing of the second protecting layer.

In some embodiments, the first protecting layer and the second protecting layer are formed over the first light-emitting layer and the second light-emitting layer, respectively.

In some embodiments, the forming of the second light-emitting layer and the second protecting layer over the substrate through the second opening of the second sacrificial layer further includes forming the second sacrificial layer over the substrate; forming the second opening in the second sacrificial layer; forming a first hole in the first protecting layer and the first light-emitting layer; and forming a second hole in the first sacrificial layer, wherein second opening overlaps the first hole and the second hole, and the second opening exposes the second pixel.

In some embodiments, a sidewall of the second opening is substantially aligned with a sidewall of the first hole and a sidewall of the second hole.

In some embodiments, the method further includes forming the second light-emitting layer and the second protecting layer over the substrate through the second opening of the second sacrificial layer, the first hole of the first protecting layer and the first light-emitting layer, and the second hole of the first sacrificial layer.

In some embodiments, the removing of the first sacrificial layer together with the second sacrificial layer further includes removing the first sacrificial layer together with an overlying portion of the first light-emitting layer, an overlying portion of the first protecting layer, the second sacrificial layer, an overlying portion of the second light-emitting layer and an overlying portion of the second protecting layer.

In some embodiments, a thickness of the first protecting layer is substantially the same as a thickness of the second protecting layer.

In some embodiments, the first protecting layer and the second protecting layer comprise halogen-containing protecting layers.

In some embodiments, the first protecting layer and the second protecting layer comprise halogen-free protecting layers.

In some embodiments, the first protecting layer is soluble in an etchant and the first light-emitting layer is insoluble or less soluble in the etchant.

In some embodiments, the etchant comprises halogen-containing solvents.

In some embodiments, the etchant comprises halogen-free solvents.

In some embodiments, the method further includes forming a pixel-defining layer to separate the first pixel from the second pixel prior to forming the first light-emitting layer and the first protecting layer.

In some embodiments, an etch selectivity of the first protecting layer and the second protecting layer are greater than that of the first light-emitting layer and the second light-emitting layer with respect to a same etchant.

In some embodiments, the first protecting layer and the second protecting layer comprise fluorine materials.

In some embodiments, the first protecting layer and the second protecting layer are substantially free of fluorine.

BRIEF DESCRIPTION OF THE DRAWINGS

FIG. 2 illustrates a top view of the intermediate stage in the manufacture of the electroluminescent device according to some embodiments of the present disclosure.

DETAILED DESCRIPTION OF THE DISCLOSURE

Figure 1:
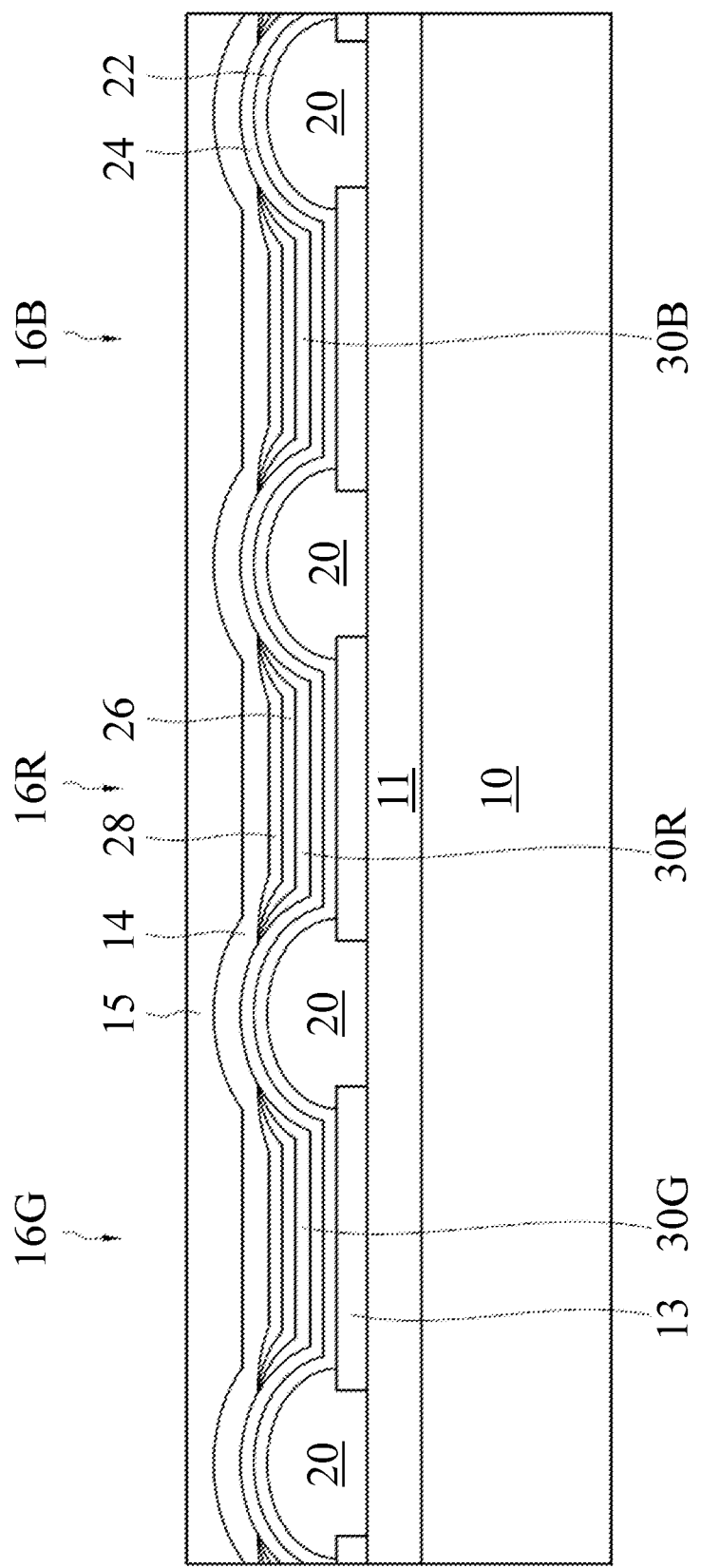
FIG. 1 illustrates an intermediate stage in the manufacture of an electroluminescent device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To achieve successful commercialization of high-resolution OLED displays, a method with low cost and high productivity is desired. One color-patterning method for OLED displays is the photolithography method. RGB color patterning is performed by lift-off processes of red, green and blue materials through a patterned photomask. This technique is widely used due to the high resolution of the displays produced. However, this method has several inherent limitations, including OLED degradation due to UV light exposure, and high fabrication cost due to the expensive production procedures of the photomask. These limitations present obstacles to the successful commercialization of high-resolution OLED displays and result in reduced display quality.

In the present disclosure, protecting layers are formed on an organic light-emitting layer in the OLED. The protecting layers covering the organic light-emitting layer protect the organic light-emitting layer, and thus the organic light-emitting layer incurs less damage during the photolithography process. In addition, the protecting layers are disposed temporarily to protect the organic light-emitting layer during fabrication, and are subsequently removed.

FIG. 1 illustrates an intermediate stage in the manufacture of an electroluminescent device in accordance with some embodiments of the present disclosure. As shown in FIG. 1, a substrate 10 is provided. The electroluminescent device may be a light-emitting device. By way of example, the electroluminescent device may be an organic light-emitting diode (OLED). In some embodiments, the electroluminescent device may be a top emission OLED, a bottom emission OLED or a transparent OLED that can be made to be both top- and bottom-emitting.

The substrate 10 may be a rigid or a flexible substrate. In addition, the substrate 10 may be an opaque or a transparent substrate. The substrate 10 can include glass, quartz, semiconductive material such as silicon, III-V group compound, or other suitable material. In some embodiments, the substrate 10 includes graphene. In some embodiments, the substrate 10 may be formed with a polymer matrix material. A dielectric layer 11 is optionally disposed over the substrate 10 as shown in FIG. 1. In some embodiments, the dielectric layer 11 may be made with silicon oxide, silicon nitride, silicon oxynitride, or other suitable materials.

As shown in FIG. 1, a plurality of light-emitting devices are disposed on the substrate 10. The light-emitting devices include a first light-emitting device 16G configured to emit a first light beam and a second light-emitting device 16R configured to emit a second light beam having a wavelength different from that of the first light beam. In addition, the first light beam is substantially within a first wavelength range, and the second light beam is substantially within a second wavelength range. In some embodiments, the light-emitting devices further include a third light-emitting device 16B configured to emit a third light beam having a wavelength different from those of the first light beam and the second light beam. The third light beam is substantially within a third wavelength range. In some embodiments, the first wavelength range includes wavelengths less than wavelengths included in the second wavelength range, and the third wavelength range includes wavelengths less than wavelengths included in the first wavelength range. Particularly, the first wavelength range is from about 495 to about 570 nm, the second wavelength range is from about 620 to about 750 nm and the third wavelength range is from about 430 to about 470 nm. More specifically, the first light beam is green light, the second light beam is red light, and the third light beam is blue light.

The plurality of light-emitting devices may have several sublayers stacked over the substrate 10. In some embodiments, the plurality of light-emitting devices may have a first electrode 13, a first carrier-injection layer 22, a first carrier-transportation layer 24, a light-emitting layer, a second carrier-transportation layer 26, a second carrier-injection layer 28 and a second electrode 14.

The first electrodes 13 are disposed over the dielectric layer 11 as shown in FIG. 1. The first electrodes 13 may include conductive materials. Specifically, the first electrodes 13 can be metal such as aluminum (Al), copper (Cu), silver (Ag), gold (Au), tungsten (W), etc. or metal alloy. In some embodiments, the first electrodes 13 can be transparent conductive material such as metal oxide. The first electrodes 13 are electrically and respectively connected to the light-emitting devices. In some embodiments, the first electrodes 13 are designed as anodes of the light-emitting devices.

A pixel-defining layer (also referred to as a PDL) 20 including a plurality of spacers is formed on the substrate 10 and separates the first electrodes 13 from one another when viewed in a thickness direction of the electroluminescent device. The pixel-defining layer 20 may be optionally disposed over the dielectric layer 11 as shown in FIG. 1. In some embodiments, the pixel-defining layer 20 partially covers the first electrodes 13 and leaves a portion of the first electrodes 13 open to receive the light-emitting devices. In some embodiments, the pixel-defining layer 20 includes polymeric material, photosensitive material or photo absorption material. In some embodiments, the pixel-defining layer 20 is formed through a photolithography operation.

The first carrier-injection layer 22 is disposed over the exposed surfaces of the pixel-defining layer 20 and the first electrodes 13. The first carrier-injection layer 22 is continuously formed across the pixel-defining layer 20 and the first electrodes 13. More specifically, the exposed surface of each first electrode 13 is configured as an effective light-emitting area for a light-emitting device. In this embodiment, all light-emitting devices use a common first carrier-injection layer 22. In some embodiments, the first carrier-injection layer 22 performs hole injection. In some embodiments, the first carrier-injection layer 22 performs electron injection. The first carrier-injection layer 22 continuously overlies the pixel-defining layer 20 and the first electrodes 13 as illustrated in FIG. 1. In some embodiments, the first carrier-injection layer 22 is organic.

The first carrier-transportation layer 24 is disposed over the pixel-defining layer 20 and the first electrodes 13. The first carrier-injection layer 22 is disposed under the first carrier-transportation layer 24. The first carrier-transportation layer 24 is continuously formed across the first carrier-injection layer 22. In this embodiment, all light-emitting devices use a common first carrier-transportation layer 24. In some embodiments, the first carrier-transportation layer 24 performs hole transportation. In some embodiments, the first carrier-transportation layer 24 performs electron transportation. The first carrier-transportation layer 24 continuously overlies the pixel-defining layer 20 and the first electrodes 13. In some embodiments, the first carrier-transportation layer 24 is organic.

A plurality of light-emitting layers is formed above the surfaces of the first electrodes 13. In some embodiments, the light-emitting layers may include a first light-emitting layer 30G, a second light-emitting layer 30R, and a third light-emitting layer 30B. The first light-emitting layer 30G, the second light-emitting layer 30R, and the third light-emitting layer 30B are respectively disposed on the first carrier-transportation layer 24. In some embodiments, a portion of the light-emitting layers may be formed on or over the pixel-defining layer 20 as illustrated in FIG. 1.

A plurality of the second carrier-transportation layers 26 is disposed on the first light-emitting layer 30G, the second light-emitting layer 30R, and the third light-emitting layer 30B respectively. In some embodiments, all light-emitting devices may use a common second carrier-transportation layer 26. The second carrier-transportation layer 26 may be used for electron transportation. In some embodiments, the second carrier-transportation layer 26 performs hole transportation. The second carrier-transportation layer 26 partially overlies the pixel-defining layer 20. The second carrier-transportation layer 26 may include organic material.

A plurality of the second carrier-injection layers 28 is disposed on the second carrier-transportation layer 26. The second carrier-injection layer 28 is formed across the exposed surfaces of the second carrier-transportation layer 26. In some embodiments, all light-emitting devices use a common second carrier-injection layer 28. The second carrier-injection layer 28 may be used for electron injection. In some embodiments, the second carrier-injection layer 28 performs hole injection. The second carrier-injection layer 28 may include organic material.

The second electrode 14 is formed above the light-emitting layers. The second electrode may include conductive materials. In some embodiments, the second electrode 14 may be provided as a transparent electrode. Examples of the transparent conductive material may include indium tin oxide (ITO), indium zinc oxide (IZO), aluminum-doped zinc oxide (AZO) and indium-doped cadmium oxide. In some embodiments, the second electrode 14 may be designed as cathode of the light-emitting device.

An encapsulation layer 15 for protecting the light-emitting layers from external environment factors such as moisture or oxygen may be provided on the second electrode 14. The encapsulation layer 15 may be formed of a thin film encapsulation layer in which a plurality of organic layers and inorganic layers crossing each other are laminated. In some embodiments, the encapsulation layer 15 may include a plurality of organic layers and a plurality of inorganic layers, which are alternately laminated. The organic layers may be formed of acrylate-based materials and the inorganic layers may be formed of oxide-based materials, but the disclosure is not limited thereto.

FIG. 2 illustrates a top view of the intermediate stage in the manufacture of the electroluminescent device according to some embodiments of the present disclosure. As shown in FIG. 2, the substrate 10 includes a plurality of pixels 12. The pixels 12 can be arranged in an array. Each independent pixel 12 is separated from other adjacent pixels 12. Each pixel 12 includes a first sub-pixel 12G, a second sub-pixel 12R and a third sub-pixel 12B. In some embodiments, the sub-pixel may be also referred to as the sub-pixel region or the pixel.

The first sub-pixel 12G, the second sub-pixel 12R and the third sub-pixel 12B may be configured to display different colors. Specifically, the first sub-pixel 12G, the second sub-pixel 12R and the third sub-pixel 12B may be configured to emit an image of a first color, an image of a second color and an image of a third color, respectively. For example, the first sub-pixel 12G may be configured to display the color green, the second sub-pixel 12R may be configured to display the color red and the third sub-pixel 12B may be configured to display the color blue.

As shown in FIG. 2, the arrangement of the sub-pixels includes, from left to right, the first sub-pixel 12G, the second sub-pixel 12R and then the third sub-pixel 12B, but is not limited thereto. The configuration of the sub-pixels may be altered according to the design or other considerations. For example, the arrangement of the sub-pixels may include, from left to right, the first sub-pixel 12G, the third sub-pixel 12B, then the second sub-pixel 12R. Further, although the sub-pixels illustrated in FIG. 2 are square in shape, the sub-pixels may have other suitable shapes. In addition, the number of sub-pixels in one pixel 12 may be, but is not limited to, three. Alternatively, the number of sub-pixels may be altered and there may be other suitable sub-pixels configured to display different colors, such as yellow, white or other colors.

Figure 3A:
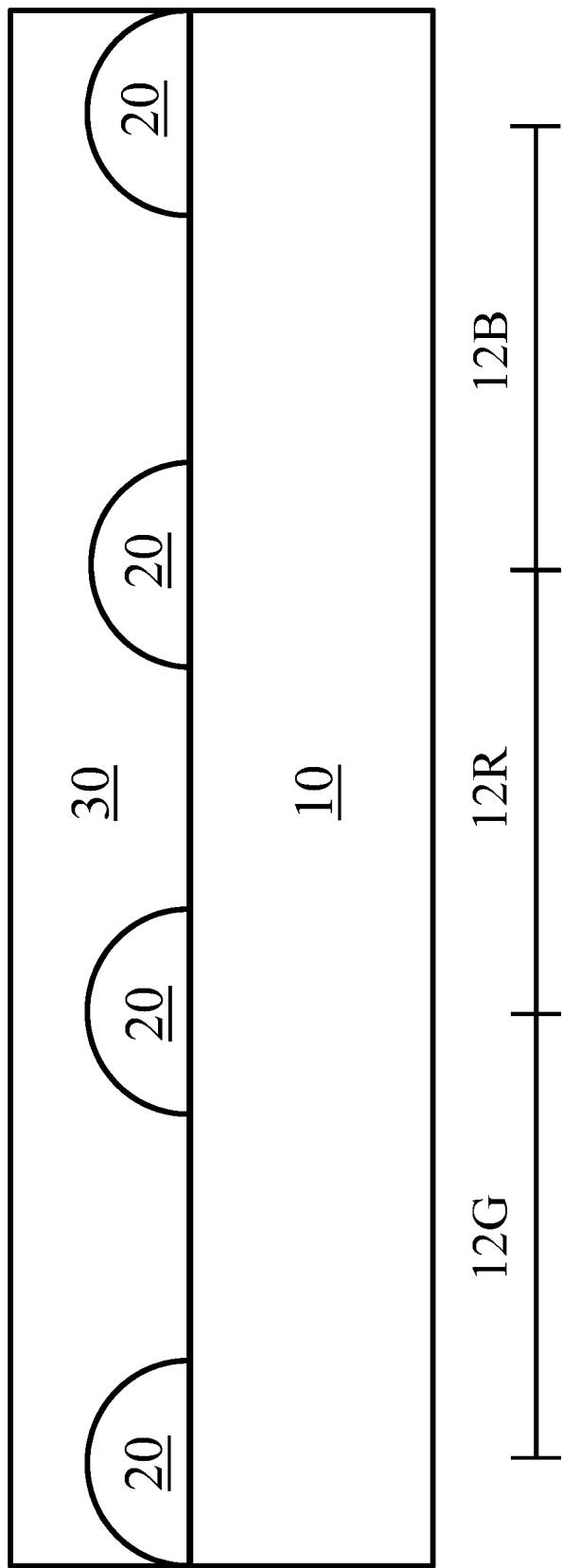
FIGS. 3A to 3N illustrate a method of manufacturing an electroluminescent device according to some embodiments of the present disclosure.
Figure 3B:
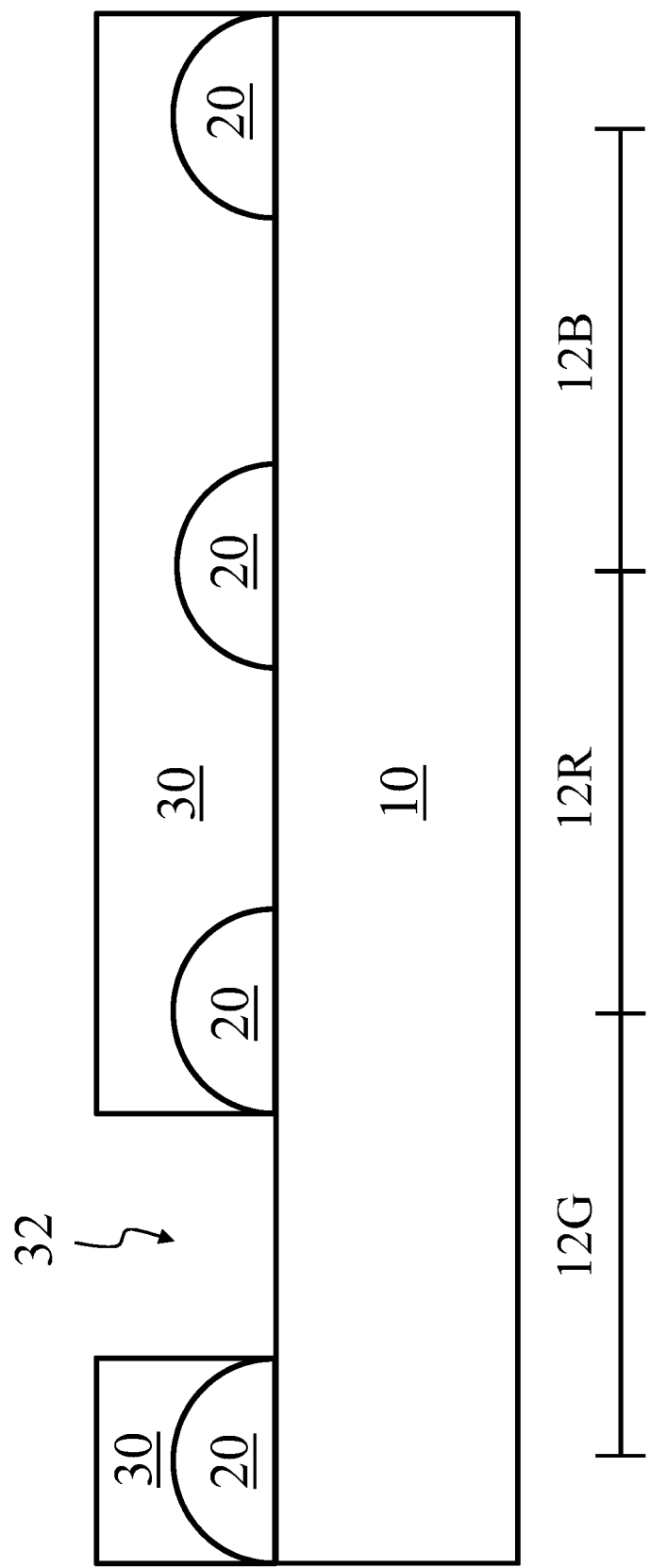
Figure 3C:
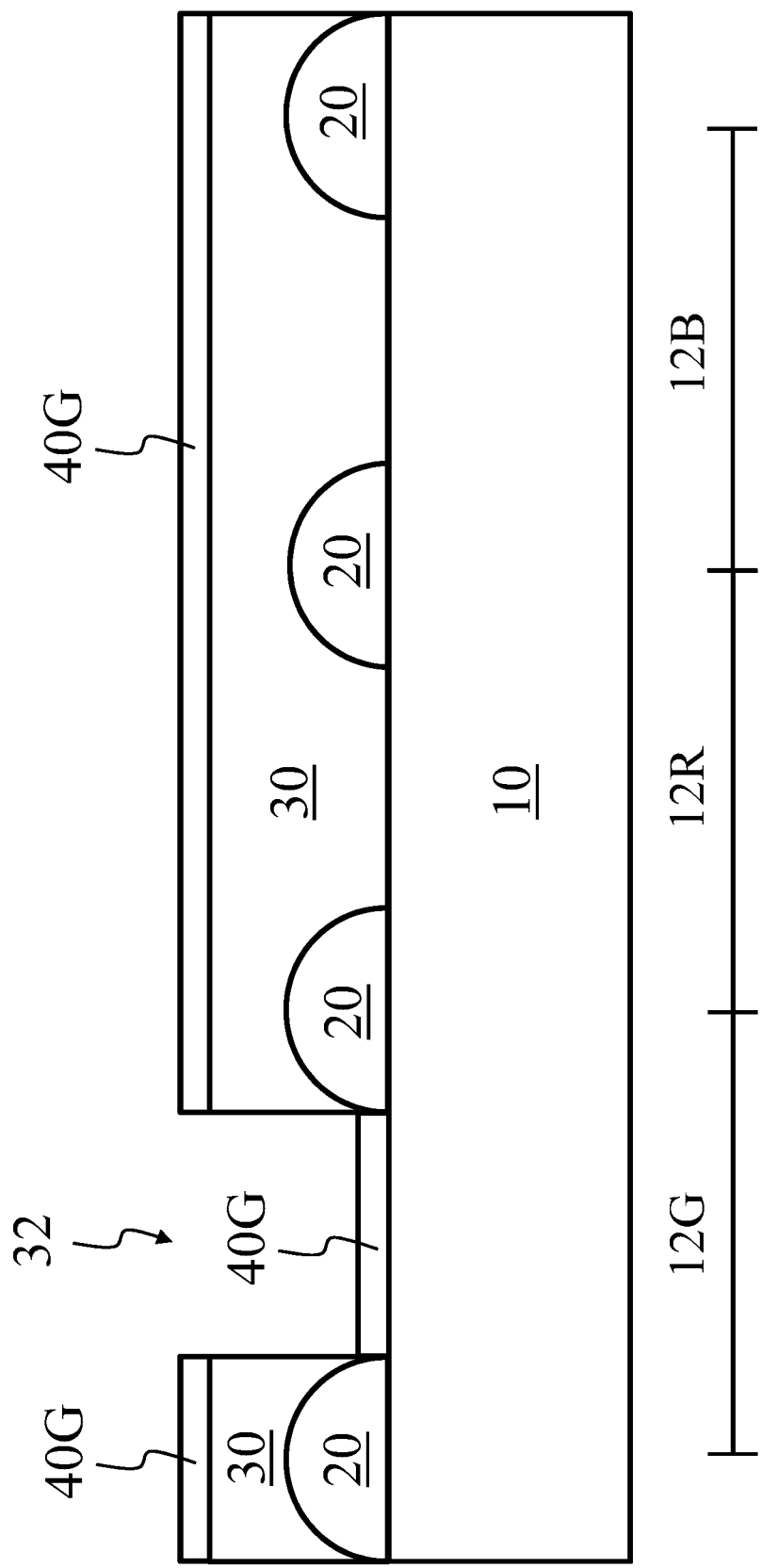
Figure 3D:
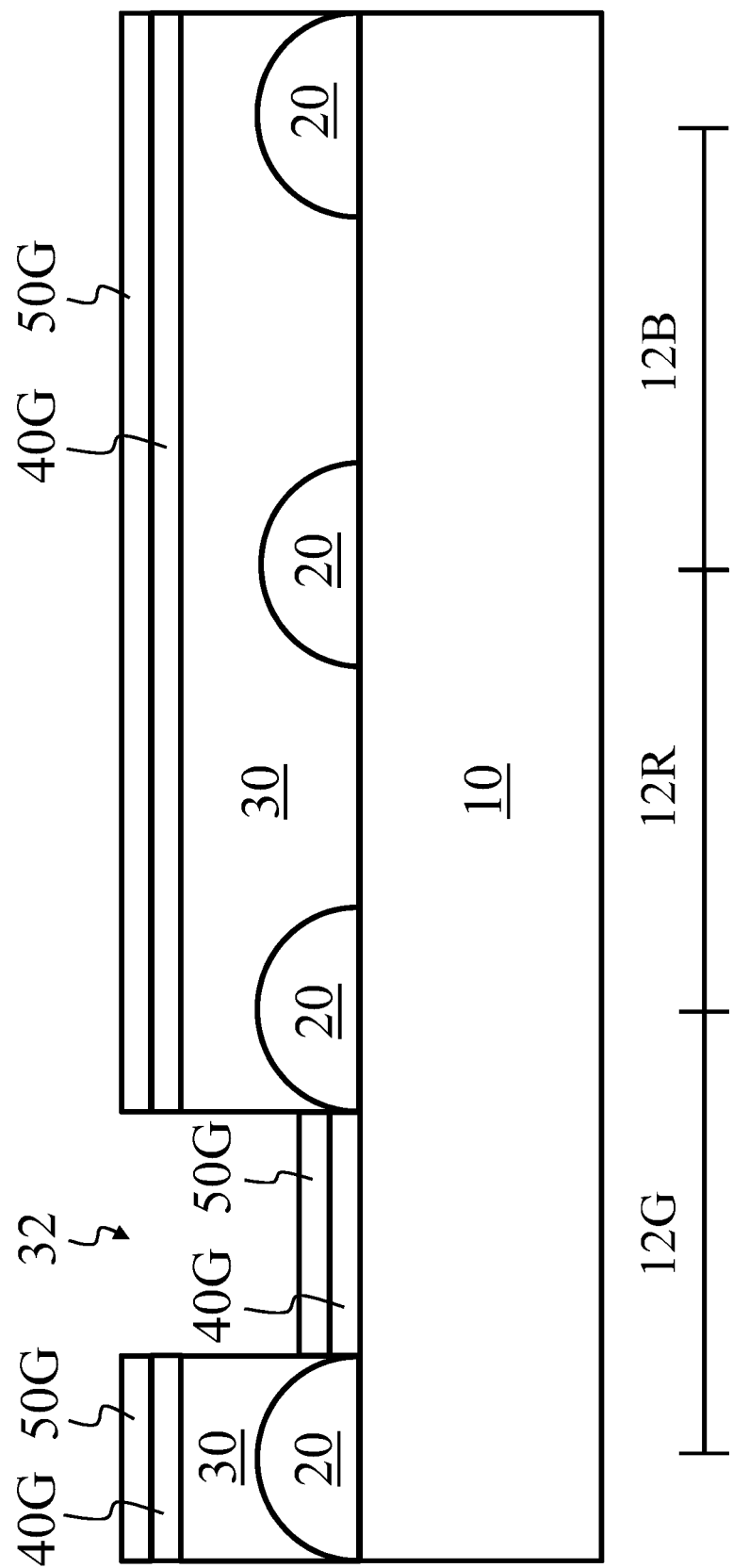
Figure 3E:
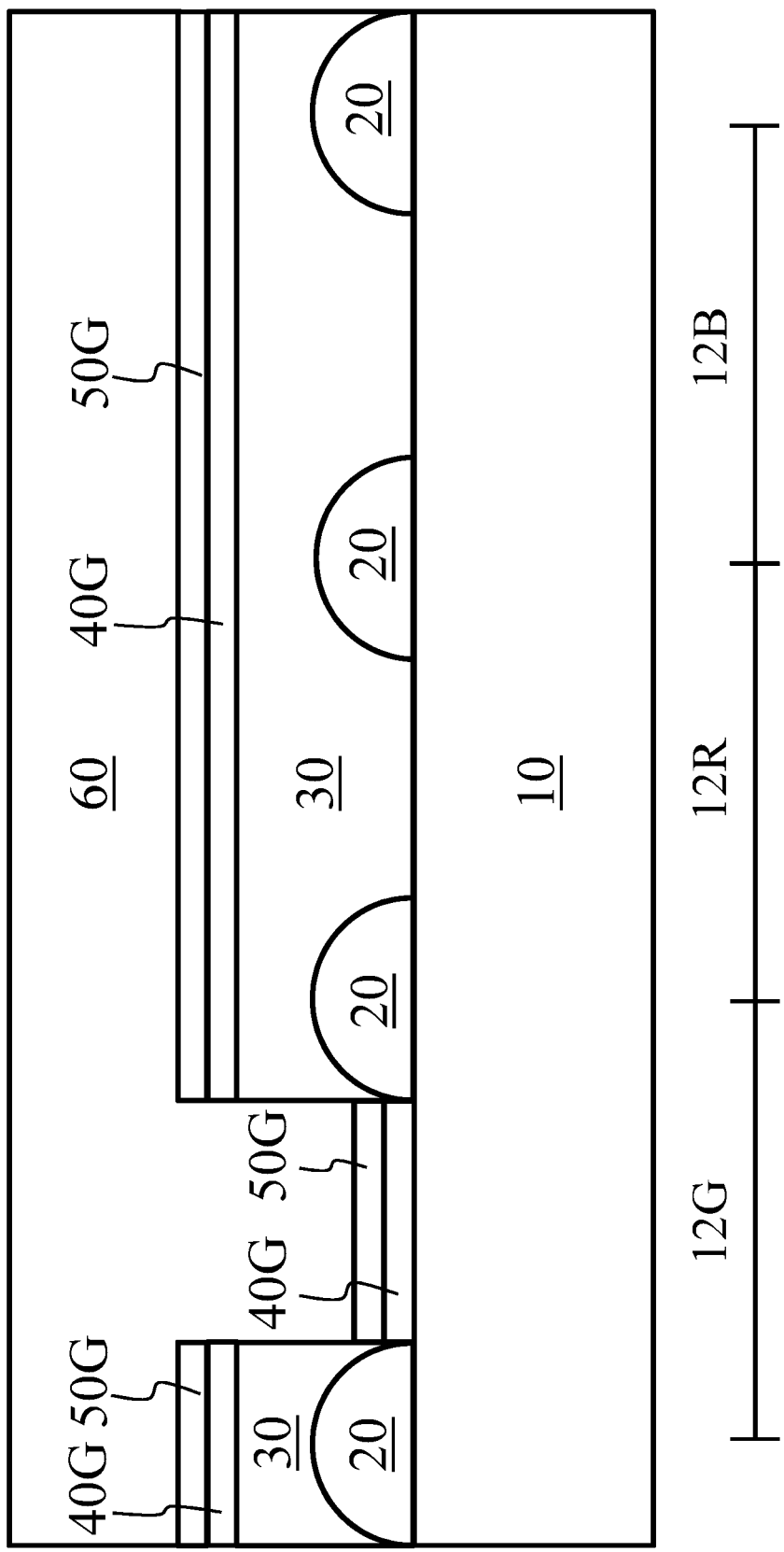
Figure 3F:
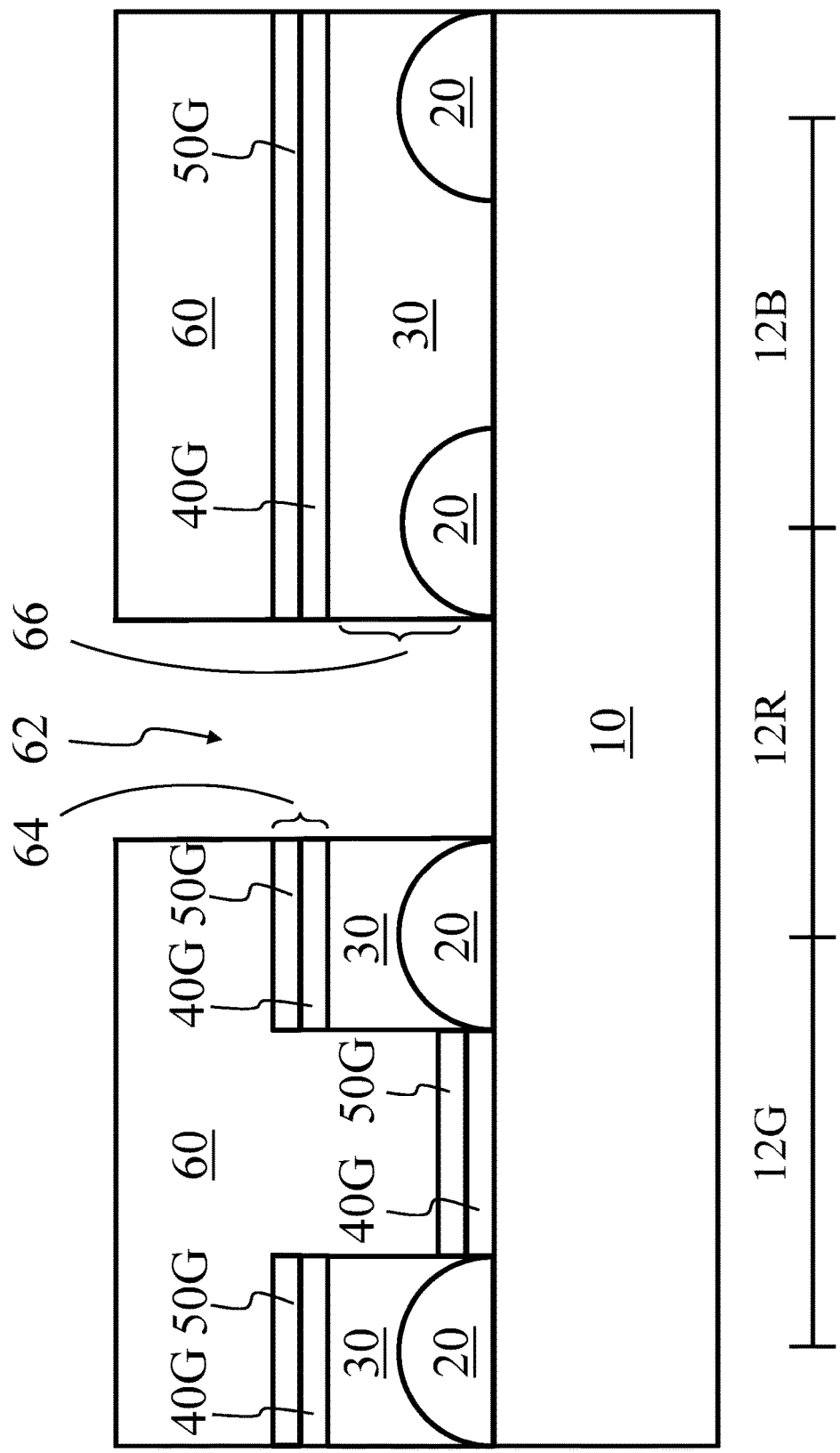
Figure 3G:
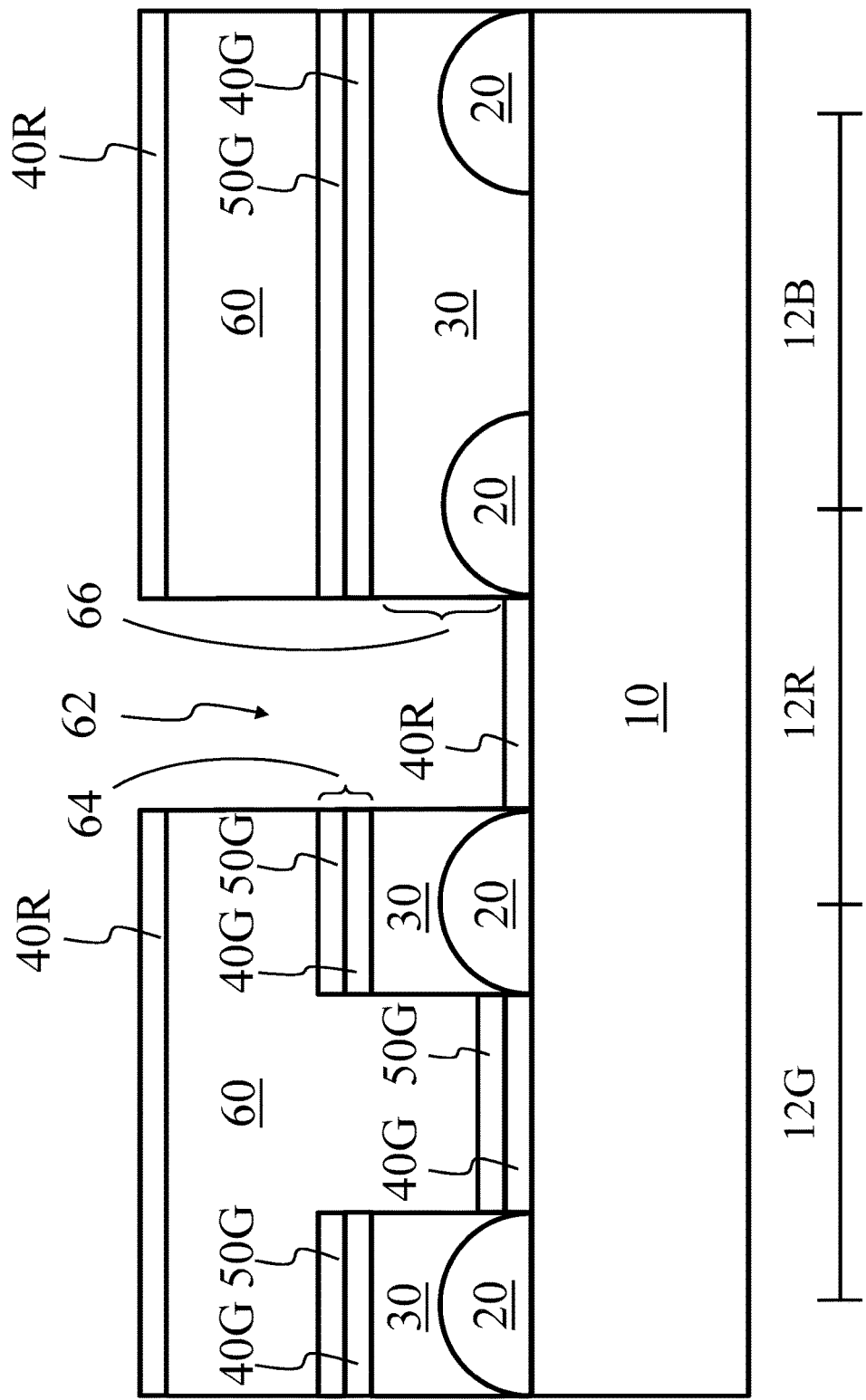
Figure 3H:
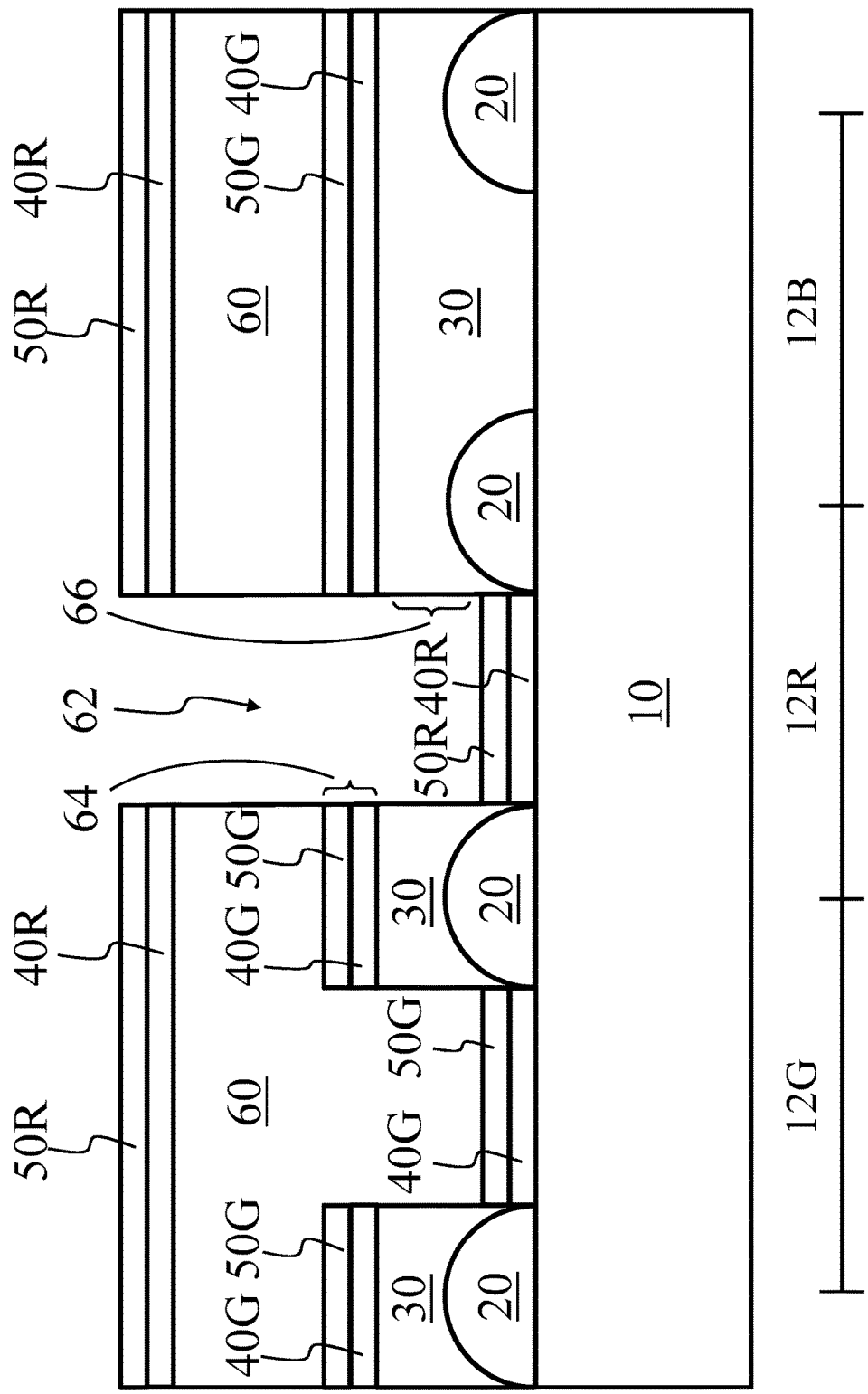
Figure 3I:
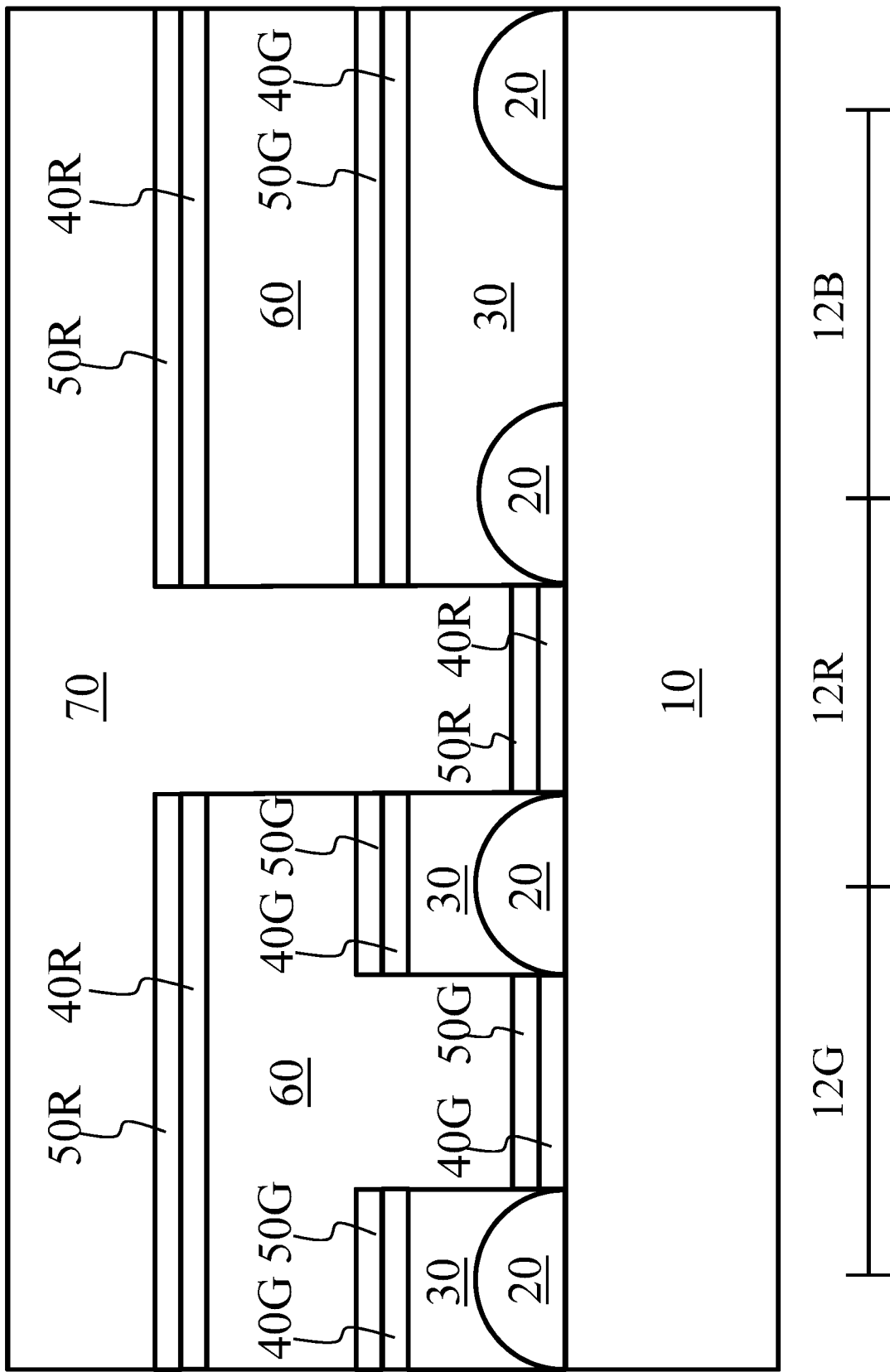
Figure 3J:
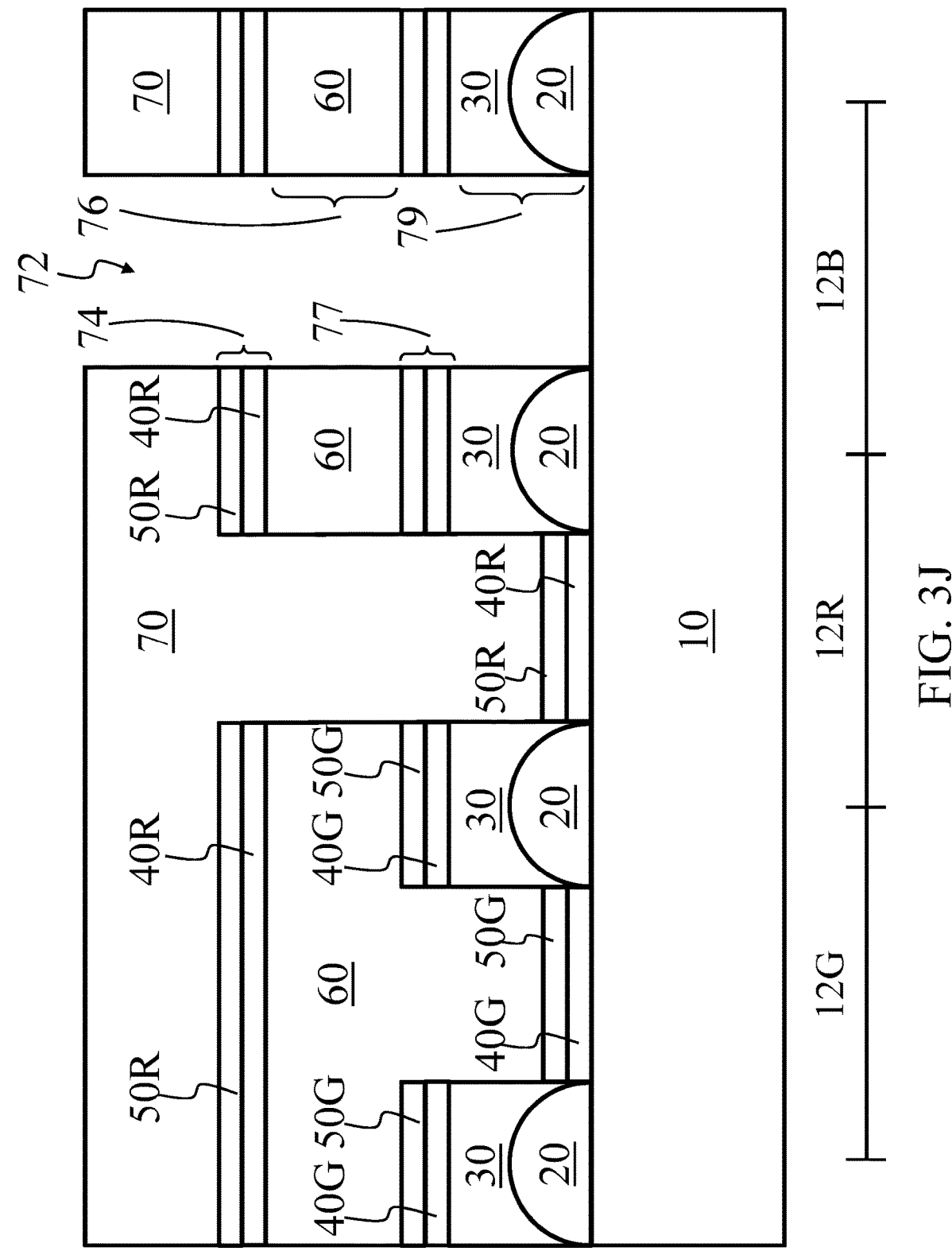
Figure 3K:
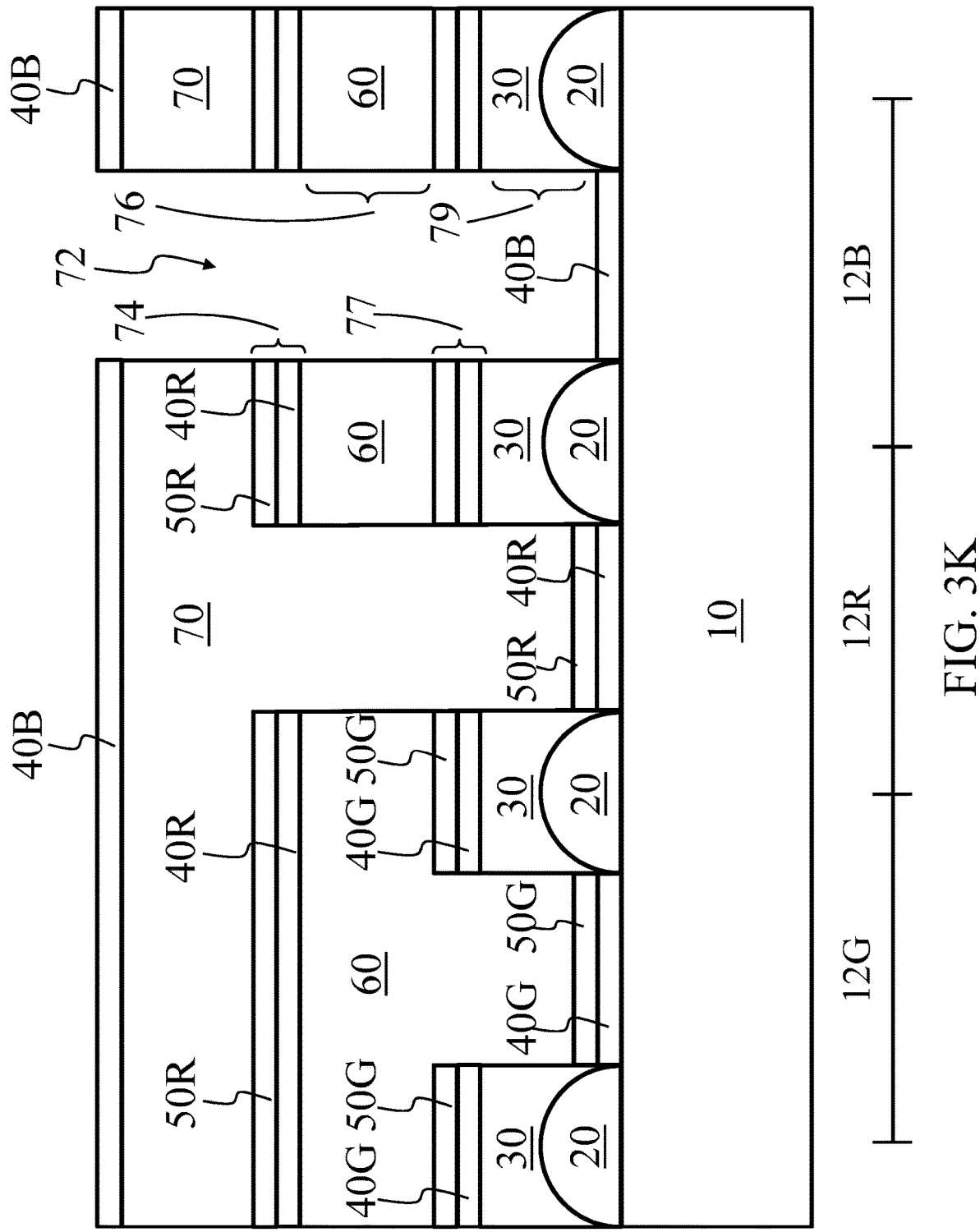
Figure 3L:
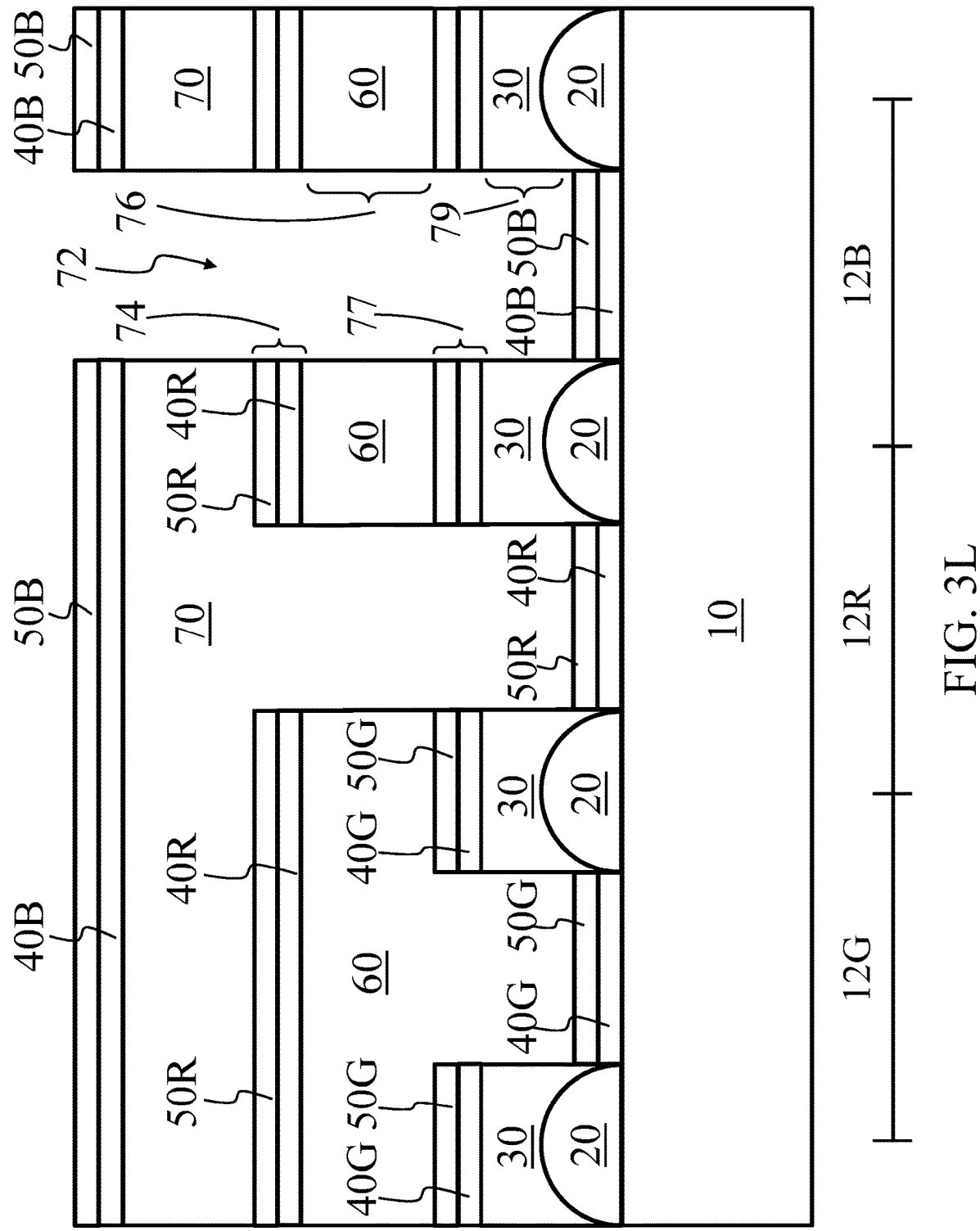
Figure 3M:
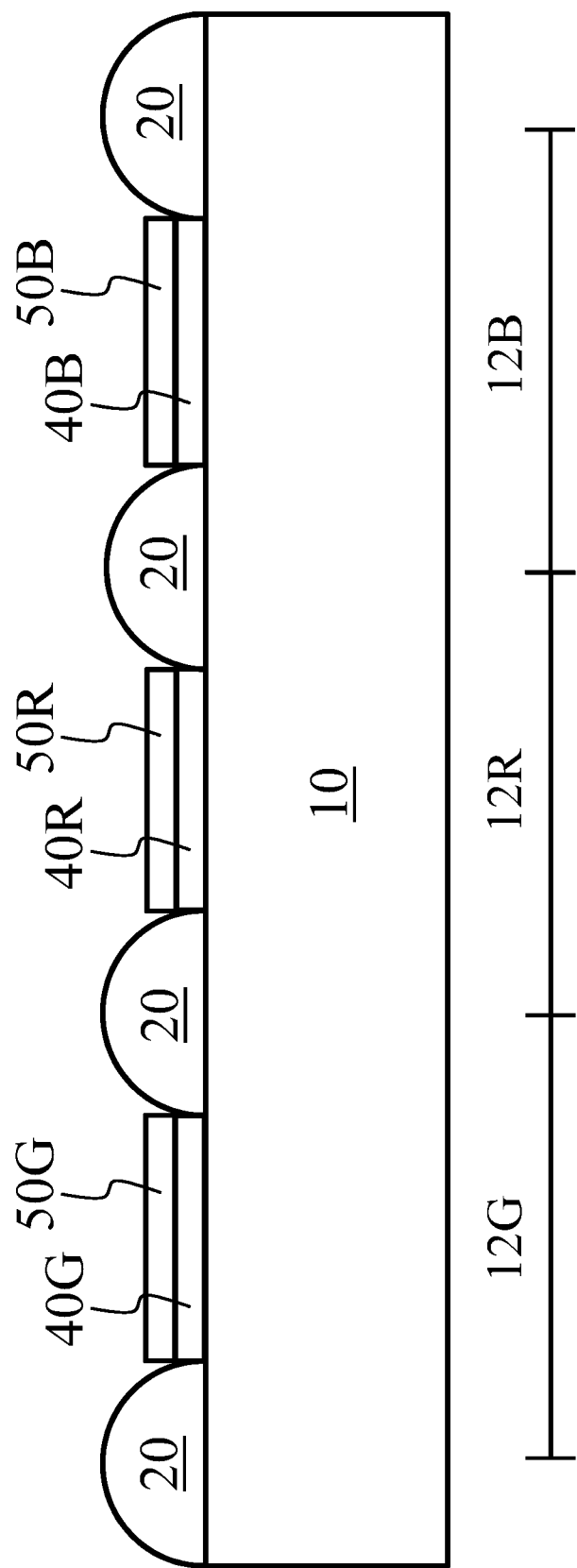
Figure 3N:
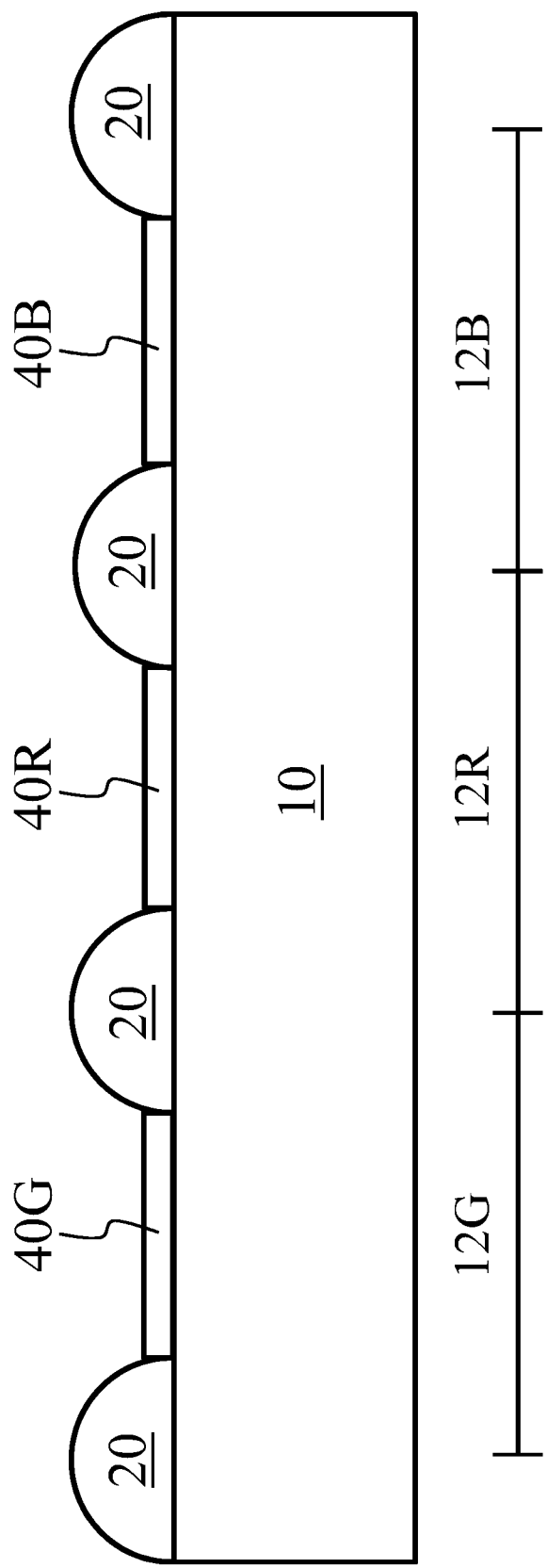

FIGS. 3A to 3N illustrate a method of manufacturing an electroluminescent device according to some embodiments of the present disclosure. As shown in FIG. 3A, a pixel-defining layer 20 is optionally formed over the substrate 10 to separate the first sub-pixel 12G, the second sub-pixel 12R and the third sub-pixel 12B. The pixel-defining layer 20 can be arranged so as to form a grid when viewed in the thickness direction of the electroluminescent device. The pattern of the pixel-defining layer 20 is designed in accordance with the desired pixel arrangement. In the present embodiment, the number of sub-pixels in one pixel 12 is three sub-pixels, but is not limited thereto.

A first sacrificial layer 30 is formed over the substrate 10. The first sacrificial layer 30 covers the first sub-pixel 12G, the second sub-pixel 12R and the third sub-pixel 12B. In some embodiments, the first sacrificial layer 30 includes a photosensitive layer. The first sacrificial layer 30 may additionally include a releasing layer (not shown) on the substrate 10. The releasing layer may be disposed between the photosensitive layer and the substrate 10. The releasing layer may serve as a planarization layer to increase the flatness of the first sacrificial layer 30 or as an adhesion layer to increase the adhesion between the photosensitive layer and the pixel-defining layer 20.

As shown in FIG. 3B, the first sacrificial layer 30 is patterned to form a first opening 32 exposing the first sub-pixel 12G. Specifically, the first sacrificial layer 30 is patterned by a photolithography process. The first sacrificial layer 30 may be heated to a predetermined temperature, then exposed to radiation of a designated wavelength. After exposure, the first sacrificial layer 30 is rinsed in a solution for development. A portion of the first sacrificial layer 30 is removed and the remaining portion is left substantially covering the second sub-pixel 12R and the third sub-pixel 12B.

As shown in FIG. 3C, a first light-emitting layer 40G is formed over the substrate 10. The first light-emitting layer 40G is formed over the first sacrificial layer 30 and on the first sub-pixel 12G through the first opening 32 of the first sacrificial layer 30. The first light-emitting layer 40G may be configured to display an image of a first color. In some embodiments, the first light-emitting layer 40G may be configured to display the color green.

In some embodiments, the first light-emitting layer 40G is organic. The first light-emitting layer 40G may be formed by a physical vapor deposition (PVD) process. A heat source evaporates organic light-emitting materials, but vapor deposition can be controlled precisely with the use of a shadow mask. The organic molecules travel through the holes of the shadow mask before reaching the substrate 10. The PVD process can include sputtering (magnetron or ion beam), which utilizes energetic ions colliding with a target to eject (or sputter) target material, or evaporation (thermal resistive or e-beam), which relies on heating a solid source material above its vaporization temperature.

As shown in FIG. 3D, a first protecting layer 50G is formed over the substrate 10. The first protecting layer 50G is formed over the first sacrificial layer 30 and on the first sub-pixel 12G through the first opening 32 of the first sacrificial layer 30. In some embodiments, the first protecting layer 50G is formed over the first light-emitting layer 40G. The first protecting layer 50G may be configured to protect the underlying first light-emitting layer 40G. In some embodiments, the first protecting layer 50G includes a halogen-containing protecting layer. The first protecting layer 50G may include a halogen-free protecting layer.

As used herein, the term "halogen-free" is used to describe the protecting layer 50G that contains substantially no halogen. The protecting layer 50G may contain trace amounts of halogens. For example, the traces amounts of halogen may be impurities presented in the protecting layer 50G during the manufacturing process. The protecting layer 50G may be considered as substantially no halogen when the trace amounts of halogens in the protecting layer 50G is less than or equal to 1%. In some embodiments, the protecting layer 50G is considered as a halogen-free when the trace amounts of halogens in the protecting layer 50G is less than or equal to 0.5%.

Referring to FIGS. 3E to 3H, operations similar to those illustrated in FIGS. 3A to 3D can be repeated to form a differently-colored light-emitting layer. As shown in FIG. 3E, a second sacrificial layer 60 is formed over the substrate 10. The second sacrificial layer 60 covers the first light-emitting layer 40G and the first protecting layer 50G. Specifically, the second sacrificial layer 60 covers the first light-emitting layer 40G and the first protecting layer 50G that are within the first opening 32 in the first sub-pixel 12G.

In some embodiments, a thickness of the second sacrificial layer 60 is not consistent. For instance, a thickness of the second sacrificial layer 60 corresponding to the first sub-pixel 12G is greater than a thickness of the second sacrificial layer 60 corresponding to the second sub-pixel 12R or the third sub-pixel 12B. In some embodiments, the second sacrificial layer 60 is filled up the first opening 32 to create a flat surface.

The second sacrificial layer 60 may have the same composition as the first sacrificial layer 30. In some embodiments, the second sacrificial layer 60 may have a composition different from that of the first sacrificial layer 30. In the present embodiment, the second sacrificial layer 60 includes a photosensitive layer.

As shown in FIG. 3F, the second sacrificial layer 60 is patterned to form a second opening 62 exposing the second sub-pixel 12R. Specifically, the second sacrificial layer 60 is patterned by a photolithography process. The second sacrificial layer 60 may be heated to a predetermined temperature, then exposed to radiation of a designated wavelength. After exposure, the second sacrificial layer 60 is rinsed in a solution for development. A portion of the second sacrificial layer 60 is removed and the remaining portion is left substantially covering the first sub-pixel 12G and the third sub-pixel 12B.

In some embodiments, a first hole 64 of the first protecting layer 50G and the first light-emitting layer 40G are formed during the formation of the second opening 62. A second hole 66 of the first sacrificial layer 30 may be formed subsequently after the formation of the first hole 64. The second opening 62 overlaps the first hole 64 and the second hole 66. The second opening 62 exposes the second pixel 12R. In some embodiments, a sidewall of the second opening 62 is substantially aligned with a sidewall of the first hole 64 and a sidewall of the second hole 66.

The first protecting layer 50G may be configured to protect the first light-emitting layer 40G during the photolithography process for forming the second opening 62. In some embodiments, the first protecting layer 50G includes UV-absorbing materials. The first protecting layer 50G may absorb the radiation such that the first light-emitting layer 40G incurs less damage. In some embodiments, the first protecting layer 50G includes heat-absorbing materials. The first protecting layer 50G may absorb the heat such that the first light-emitting layer 40G undergoes less temperature variation.

Referring to FIG. 3G, a second light-emitting layer 40R is formed over the second sacrificial layer 60 and on the second sub-pixel 12R through the second opening 62 of the second sacrificial layer 60. In some embodiments, the second light-emitting layer 40R is formed on the second sub-pixel 12R through the second opening 62 of the second sacrificial layer 60, the first hole 64 of the first protecting layer 50G and the first light-emitting layer 40G, and the second hole 66 of the first sacrificial layer 30. The second light-emitting layer 40R may be configured to display an image of a second color. In some embodiments, the second light-emitting layer 40R may be configured to display the color red.

As shown in FIG. 3H, a second protecting layer 50R is formed over the second sacrificial layer 60 and on the second sub-pixel 12R through the second opening 62 of the second sacrificial layer 60. In some embodiments, the second protecting layer 50R is formed over the second light-emitting layer 40R. The second protecting layer 50R is formed on the second light-emitting layer 40R in the second sub-pixel 12R through the second opening 62 of the second sacrificial layer 60, the first hole 64 of the first protecting layer 50G and the first light-emitting layer 40G, and the second hole 66 of the first sacrificial layer 30. The second protecting layer 50R may be configured to protect the underlying second light-emitting layer 40R. In some embodiments, the second protecting layer 50R includes UV-absorbing materials. In some embodiments, the second protecting layer 50R includes a halogen-containing protecting layer. The second protecting layer 50R may include a halogen-free protecting layer, i.e., a protecting layer that contains substantially no halogen.

Referring to FIGS. 3 to 3L, operations similar to those illustrated in FIGS. 3E to 3H can be repeated to form a light-emitting layer that emits light of a different color. As shown in FIG. 3I, a third sacrificial layer 70 is formed over the substrate 10. The third sacrificial layer 70 covers the second light-emitting layer 40R and the second protecting layer 50R. Specifically, the third sacrificial layer 70 covers the second light-emitting layer 40R and the second protecting layer 50R that are within the second opening 62 in the second sub-pixel 12R.

In some embodiments, a thickness of the third sacrificial layer 70 is not consistent. For instance, a thickness of the third sacrificial layer 70 corresponding to the second sub-pixel 12R is greater than a thickness of the third sacrificial layer 70 corresponding to the third sub-pixel 12B or the first sub-pixel 12G. In some embodiments, the third sacrificial layer 70 is filled up the second opening 62 to create a flat surface.

The third sacrificial layer 70 may have the same composition as the first sacrificial layer 30. In some embodiments, the third sacrificial layer 70 may have a composition different from that of the first sacrificial layer 30. In the present embodiment, the third sacrificial layer 60 includes a photosensitive layer.

As shown in FIG. 3J, the third sacrificial layer 70 is patterned to form a third opening 72 exposing the third sub-pixel 12B. Specifically, the third sacrificial layer 70 is patterned by a photolithography process. The third sacrificial layer 70 may be heated to a predetermined temperature, then exposed to radiation of a designated wavelength. After exposure, the third sacrificial layer 70 is rinsed in a solution for development. A portion of the third sacrificial layer 70 is removed and the remaining portion is left substantially covering the first sub-pixel 12G and the second sub-pixel 12R.

In some embodiments, a first hole 74 of the second protecting layer 50R and the second light-emitting layer 40R are formed during the formation of the third opening 72. A second hole 76 of the second sacrificial layer 60 may be formed subsequently after the formation of the first hole 74. A third hole 77 of the first protecting layer 50G and the first light-emitting layer 40G are formed after the formation of the second hole 76. A fourth hole 79 of the first sacrificial layer 30 may be formed subsequently after the formation of the third hole 77. The third opening 72 overlaps the first hole 74, the second hole 76, the third hole 77 and the fourth hole 79. The third opening 72 exposes the third pixel 12B. In some embodiments, a sidewall of the third opening 72 is substantially aligned with a sidewall of the first hole 74, a sidewall of the second hole 76, a sidewall of the third hole 77 and a sidewall of the fourth hole 79.

The second protecting layer 50R may be configured to protect the second light-emitting layer 40R during the photolithography process for forming the third opening 72. In some embodiments, the second protecting layer 50R includes UV-absorbing materials. The second protecting layer 50R may absorb the radiation such that the second light-emitting layer 40R incurs less damage. In some embodiments, the second protecting layer 50R includes heat-absorbing materials. The second protecting layer 50R may absorb the heat such that the second light-emitting layer 40R undergoes less temperature variation.

The first protecting layer 50G, the second sacrificial layer 60, the second light-emitting layer 40R, and the second protecting layer 50R may be configured to protect the first light-emitting layer 40G during the photolithography process for forming the third opening 72. In some embodiments, the second sacrificial layer 60 may also include UV-absorbing materials. The second sacrificial layer 60 and the first protecting layer 50G may absorb the radiation such that the first light-emitting layer 40G incurs less damage.

Referring to FIG. 3K, a third light-emitting layer 40B is formed over the third sacrificial layer 70 and on the third sub-pixel 12B through the third opening 72 of the third sacrificial layer 70. In some embodiments, the third light-emitting layer 40B is formed on the third sub-pixel 12B through the third opening 72 of the third sacrificial layer 70, the first hole 74 of the second protecting layer 50R and the second light-emitting layer 40R, the second hole 76 of the second sacrificial layer 60, the third hole 77 of the first protecting layer 50G and the first light-emitting layer 40G, and the fourth hole 79 of the first sacrificial layer 30. The third light-emitting layer 40B may be configured to display an image of a third color. In some embodiments, the third light-emitting layer 40B may be configured to display the color blue.

As shown in FIG. 3L, a third protecting layer 50B is formed over the third sacrificial layer 70 and on the third sub-pixel 12B through the third opening 72 of the third sacrificial layer 70. In some embodiments, the third protecting layer 50B is formed over the third light-emitting layer 40B. The third protecting layer 50B is formed on third light-emitting layer 40B in the third sub-pixel 12B through the third opening 72 of the third sacrificial layer 70, the first hole 74 of the second protecting layer 50R and the second light-emitting layer 40R, the second hole 76 of the second sacrificial layer 60, the third hole 77 of the first protecting layer 50G and the first light-emitting layer 40G, and the fourth hole 79 of the first sacrificial layer 30. The third protecting layer 50B may be configured to protect the underlying third light-emitting layer 40B. In some embodiments, the third protecting layer 50B includes UV-absorbing materials. In some embodiments, the third protecting layer 50B includes a halogen-containing protecting layer. The third protecting layer 50B may include a halogen-free protecting layer, i.e., a protecting layer that contains substantially no halogen.

Referring to FIG. 3M, the first sacrificial layer 30 is removed. The first sacrificial layer 30 may be removed by a lift-off process. The first sacrificial layer 30 may be removed together with the second sacrificial layer 60 and the third sacrificial layer 70. The first sacrificial layer 30 may be removed together with the overlying layers including an overlying portion of the first light-emitting layer 40G, an overlying portion of the first protecting layer 50G, the second sacrificial layer 60, an overlying portion of the second light-emitting layer 40R, an overlying portion of the second protecting layer 50R, the third sacrificial layer 70, an overlying portion of the third light-emitting layer 40B and an overlying portion of the third protecting layer 50B. In other words, the first sacrificial layer 30 is washed out simultaneously with the overlying layers that are on the surface of the first sacrificial layer 30.

As defined herein, use of the term "simultaneously" indicates that the first sacrificial layer 30, the overlying portion of the first light-emitting layer 40G, the overlying portion of the first protecting layer 50G, the second sacrificial layer 60, the overlying portion of the second light-emitting layer 40R, the overlying portion of the second protecting layer 50R, the third sacrificial layer 70, the overlying portion of the third light-emitting layer 40B and the overlying portion of the third protecting layer 50B may be removed in a single lift-off process. Alternatively, the first sacrificial layer 30, the overlying portion of the first light-emitting layer 40G, the overlying portion of the first protecting layer 50G, the second sacrificial layer 60, the overlying portion of the second light-emitting layer 40R, the overlying portion of the second protecting layer 50R, the third sacrificial layer 70, the overlying portion of the third light-emitting layer 40B and the overlying portion of the third protecting layer 50B may be removed in different steps of the lift-off process.

It is worth noting that the first sacrificial layer 30 and the second sacrificial layer 60 are not removed until the last light-emitting layer is formed. The first sacrificial layer 30 and the second sacrificial layer 60 are designed to be removed together. In some embodiments, the first sacrificial layer 30 and the second sacrificial layer 60 are designed to be removed together with the third sacrificial layer 70. Thus, the procedures of the method for manufacturing the electroluminescent device are simplified and cost-effective.

A portion of the first light-emitting layer 40G and a portion of the first protecting layer 50G that are within the first opening 32 remain in place and substantially cover the first sub-pixel 12G. A portion of the second light-emitting layer 40R and a portion of the second protecting layer 50R that are within the second opening 62 remain in place and substantially cover the second sub-pixel 12R. Further, a portion of the third light-emitting layer 40B and a portion of the third protecting layer 50B that are within the third opening 72 remain in place and substantially cover the third sub-pixel 12B.

The first protecting layer 50G, the second protecting layer 50R and the third protecting layer 50B may be respectively configured to protect the first light-emitting layer 40G, the second light-emitting layer 40R and the third light-emitting layer 40B during the lift-off process for removing the first sacrificial layer 30, the second sacrificial layer 60 and the third sacrificial layer 70. As a result, a pixel structure with the first light-emitting layer 40G and the first protecting layer 50G on the first sub-pixel 12G, the second light-emitting layer 40R and the second protecting layer 50R on the second sub-pixel 12R, and the third light-emitting layer 40B and the third protecting layer 50B on the third sub-pixel 12B is formed.

Referring to FIG. 3N, the first protecting layer 50G, the second protecting layer 50R and the third protecting layer 50B are respectively removed from the first light-emitting layer 40G, the second light-emitting layer 40R and the third light-emitting layer 40B. The first light-emitting layer 40G, the second light-emitting layer 40R and the third light-emitting layer 40B are left substantially in the first sub-pixel 12G, the second sub-pixel 12R and the third sub-pixel 12B, respectively.

It is worth noting that the first protecting layer 50G, the second protecting layer 50R and the third protecting layer 50B are not removed until the first sacrificial layer 30 is removed. The first protecting layer 50G, the second protecting layer 50R and the third protecting layer 50B are designed to be removed together after the removing of the first sacrificial layer 30, the second sacrificial layer 60 and the third sacrificial layer 70. Thus, the procedures of the method for manufacturing the electroluminescent device are simplified and cost-effective.

In some embodiments, a thickness of the first protecting layer 50G is substantially the same as a thickness of the second protecting layer 50R. The thickness of the second protecting layer 50R is substantially the same as a thickness of the third protecting layer 50B. The first protecting layer 50G, the second protecting layer 50R and the third protecting layer 50B may be simultaneously removed from the first light-emitting layer 40G, the second light-emitting layer 40R and the third light-emitting layer 40B, respectively. The first protecting layer 50G, the second protecting layer 50R and the third protecting layer 50B may be removed by an etching process, but the present disclosure is not limited thereto.

As defined herein, use of the term "simultaneously" indicates that the first protecting layer 50G, the second protecting layer 50R and the third protecting layer 50B may be removed in a single etching process. Alternatively, the first protecting layer 50G, the second protecting layer 50R and the third protecting layer 50B may be removed in different steps of the etching process.

In some embodiments, the first protecting layer 50G, the second protecting layer 50R and the third protecting layer 50B may be removed at the same time.

In some embodiments, the first protecting layer 50G, the second protecting layer 50R and the third protecting layer 50B are soluble in an etchant, and the first light-emitting layer 40G, the second light-emitting layer 40R and the third light-emitting layer 40B are insoluble or less soluble in the etchant. The first protecting layer 50G, the second protecting layer 50R and the third protecting layer 50B may be removed in a way that causing less damage to the first light-emitting layer 40G, the second light-emitting layer 40R and the third light-emitting layer 40B. In some embodiments, the etchant includes halogen-containing solvents. In some embodiments, the etchant may include halogen-free solvents.

As used herein, the term "halogen-free" is used to describe the solvent that contains substantially no halogen. The solvent may contain trace amounts of halogens. For example, the traces amounts of halogen may be impurities presented in the solvent during the manufacturing process. The solvent may be considered as substantially no halogen when the trace amounts of halogens in the solvent is less than or equal to 1%. In some embodiments, the solvent is considered as a halogen-free when the trace amounts of halogens in the solvent is less than or equal to 0.5%.

In some embodiments, an etch selectivity of the first protecting layer 50G, the second protecting layer 50R and the third protecting layer 50B are greater than that of the first light-emitting layer 40G, the second light-emitting layer 40R and the third light-emitting layer 40B with respect to a same etchant. The first protecting layer 50G, the second protecting layer 50R and the third protecting layer 50B may be etched away, and leaves the first light-emitting layer 40G, the second light-emitting layer 40R and the third light-emitting layer 40B substantially unharmed. In some embodiments, the first protecting layer 50G, the second protecting layer 50R and the third protecting layer 50B include fluorine materials. The first protecting layer 50G, the second protecting layer 50R and the third protecting layer 50B may be substantially free of fluorine.

As used herein, the term "free of fluorine" is used to describe the first protecting layer 50G, the second protecting layer 50R and the third protecting layer 50B that contain substantially no fluorine. The first protecting layer 50G, the second protecting layer 50R and the third protecting layer 50B may contain trace amounts of fluorine. For example, the traces amounts of fluorine may be impurities presented in the first protecting layer 50G, the second protecting layer 50R or the third protecting layer 50B during the manufacturing process. The first protecting layer 50G, the second protecting layer 50R and the third protecting layer 50B may be considered as substantially free of fluorine when the trace amounts of fluorine in them are less than or equal to 1%. In some embodiments, the first protecting layer 50G, the second protecting layer 50R and the third protecting layer 50B are considered as substantially free of fluorine when the trace amounts of fluorine in them are less than or equal to 0.5%.

The first carrier-injection layer 22 and the first carrier-transportation layer 24 may be formed prior to the forming of the first light-emitting layer 40G. The second carrier-injection layer 28 and the second carrier-transportation layer 26 may be formed by the same patterning process as that used to form the first light-emitting layer 40G, the second light-emitting layer 40R or the third light-emitting layer 40B, but are not limited thereto. In some embodiments, the second carrier-injection layer 28 and the second carrier-transportation layer 26 may be formed prior to the forming of the first protecting layer 50G, the second protecting layer 50R or the third protecting layer 50B. The second carrier-injection layer 28 and the second carrier-transportation layer 26 may be formed after the removing of the first protecting layer 50G, the second protecting layer 50R or the third protecting layer 50B.

The second electrode 15 may be formed on the substrate 10 prior to the forming of the first protecting layer 50G, the second protecting layer 50R or the third protecting layer 50B. The second electrode 15 may be formed by the same patterning process as that used to form the first light-emitting layer 40G, the second light-emitting layer 40R or the third light-emitting layer 40B, but is not limited thereto. In some embodiments, the second electrode 15 may be formed on the substrate 10 after the removing of the first protecting layer 50G, the second protecting layer 50R or the third protecting layer 50B.

Although not intended to be limiting, the present disclosure provides protecting layers 50G, 50R and 50B for the temporary protection of vulnerable organic light-emitting layers 40G, 40R and 40B. The protecting layers 50G, 50R and 50B covering the organic light-emitting layers 40G, 40R and 40B protect the organic light-emitting layers 40G, 40R and 40B. Thus, the organic light-emitting layers 40G, 40R and 40B incur less damage during the photolithography process. The method of manufacturing an electroluminescent device simplifies the fabrication procedures by removing the sacrificial layers 30, 60 and 70 in a single step. Accordingly, reduced manufacturing costs can be expected. Therefore, a high-resolution electroluminescent device may be formed in a cost-effective manner.

The embodiments of the present disclosure provide significant improvements to the methods for manufacturing electroluminescent devices. The present disclosure provides protecting layers for the sensitive organic light-emitting layers. The protecting layers prevent the organic light-emitting layers from damage during the photolithography processes. The method overcomes process constraints of the photolithography process by minimizing the process procedures. Further, less damage is incurred by the organic light-emitting layer and reduced manufacturing cost can be expected. Therefore, a high-resolution electroluminescent device is formed in a cost-effective manner.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to +10% of that numerical value, such as less than or equal to 5%, less than or equal to ±4%, less than or equal to 3%, less than or equal to 2%, less than or equal to 1%, less than or equal to 0.5%, less than or equal to 0.1%, or less than or equal to 0.05%. For example, two numerical values can be deemed to be "substantially" the same or equal if the difference between the values is less than or equal to ±10% of an average of the values, such as less than or equal to ±5%, less than or equal to +4%, less than or equal to +3%, less than or equal to 2%, less than or equal to 1%, less than or equal to 0.5%, less than or equal to 0.1%, or less than or equal to ±0.05%. For example, "substantially" parallel can refer to a range of angular variation relative to 0° that is less than or equal to 10°, such as less than or equal to 5°, less than or equal to 4°, less than or equal to 3°, less than or equal to 2°, less than or equal to 10, less than or equal to 0.5°, less than or equal to 0.1°, or less than or equal to +0.05°. For example, "substantially" perpendicular can refer to a range of angular variation relative to 90° that is less than or equal to 10°, such as less than or equal to 5°, less than or equal to 4°, less than or equal to 3°, less than or equal to 2°, less than or equal to 1°, less than or equal to +0.5°, less than or equal to +0.1°, or less than or equal to 0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing an electroluminescent device, comprising:
   providing a substrate including a first pixel and a second pixel configured to emit different colors;
   forming a first light-emitting layer and a first protecting layer over the substrate through a first opening of a first sacrificial layer;
   forming a second light-emitting layer and a second protecting layer over the substrate through a second opening of a second sacrificial layer;
   removing the first sacrificial layer together with the second sacrificial layer; and
   removing the first protecting layer from the first light-emitting layer, and the second protecting layer from the second light-emitting layer.

2. The method of claim 1, wherein the removing of the first sacrificial layer together with the second sacrificial layer is performed prior to the removing of the first protecting layer and the second protecting layer.

3. The method of claim 1, wherein the removing of the first protecting layer is performed together with the removing of the second protecting layer.

4. The method of claim 1, wherein the first protecting layer and the second protecting layer are formed over the first light-emitting layer and the second light-emitting layer, respectively.

5. The method of claim 1, wherein the forming of the second light-emitting layer and the second protecting layer over the substrate through the second opening of the second sacrificial layer further comprises:
- forming the second sacrificial layer over the substrate;
- forming the second opening in the second sacrificial layer;
- forming a first hole in the first protecting layer and the first light-emitting layer; and
- forming a second hole in the first sacrificial layer,
- wherein the second opening overlaps the first hole and the second hole, and the second opening exposes the second pixel.

6. The method of claim 5, wherein a sidewall of the second opening is substantially aligned with a sidewall of the first hole and a sidewall of the second hole.

7. The method of claim 5, further comprising:
- forming the second light-emitting layer and the second protecting layer over the substrate through the second opening of the second sacrificial layer, the first hole of the first protecting layer and the first light-emitting layer, and the second hole of the first sacrificial layer.

8. The method of claim 1, wherein the removing of the first sacrificial layer together with the second sacrificial layer further comprises:
- removing the first sacrificial layer together with an overlying portion of the first light-emitting layer, an overlying portion of the first protecting layer, the second sacrificial layer, an overlying portion of the second light-emitting layer and an overlying portion of the second protecting layer.

9. The method of claim 1, wherein a thickness of the first protecting layer is substantially the same as a thickness of the second protecting layer.

10. The method of claim 1, wherein the first protecting layer and the second protecting layer comprise halogen-containing protecting layers.

11. The method of claim 1, wherein the first protecting layer and the second protecting layer comprise halogen-free protecting layers.

12. The method of claim 1, wherein the first protecting layer is soluble in an etchant and the first light-emitting layer is insoluble or less soluble in the etchant.

13. The method of claim 12, wherein the etchant comprises halogen-containing solvents.

14. The method of claim 12, wherein the etchant comprises halogen-free solvents.

15. The method of claim 1, further comprising forming a pixel-defining layer to separate the first pixel from the second pixel prior to forming the first light-emitting layer and the first protecting layer.

16. The method of claim 1, wherein an etch selectivity of the first protecting layer and the second protecting layer are greater than that of the first light-emitting layer and the second light-emitting layer with respect to a same etchant.

17. The method of claim 16, wherein the first protecting layer and the second protecting layer comprise fluorine materials.

18. The method of claim 16, wherein the first protecting layer and the second protecting layer are substantially free of fluorine.

* * * * *